United States Patent
Peng et al.

(10) Patent No.: US 8,456,841 B2
(45) Date of Patent: Jun. 4, 2013

(54) CONTAINER DATA CENTER

(75) Inventors: Wen-Tang Peng, New Taipei (TW); Yi-Liang Hsiao, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 130 days.

(21) Appl. No.: 13/212,183

(22) Filed: Aug. 18, 2011

(65) Prior Publication Data

US 2012/0281357 A1   Nov. 8, 2012

(30) Foreign Application Priority Data

May 4, 2011 (TW) .............................. 100115584 A

(51) Int. Cl.
*H05K 7/20* (2006.01)
(52) U.S. Cl.
USPC ........................... 361/695; 361/694; 454/184
(58) Field of Classification Search
None
See application file for complete search history.

(56) References Cited

U.S. PATENT DOCUMENTS

| | | | |
|---|---|---|---|
| 7,342,789 B2* | 3/2008 | Hall et al. | 361/701 |
| 7,854,652 B2* | 12/2010 | Yates et al. | 454/184 |
| 8,004,839 B2* | 8/2011 | Sato et al. | 361/696 |
| 8,251,785 B2* | 8/2012 | Schmitt et al. | 454/184 |
| 2008/0024977 A1* | 1/2008 | Coglitore et al. | 361/687 |
| 2008/0123288 A1* | 5/2008 | Hillis | 361/687 |
| 2008/0160899 A1* | 7/2008 | Henry et al. | 454/184 |
| 2010/0101626 A1* | 4/2010 | Iwazaki et al. | 136/244 |
| 2011/0149500 A1* | 6/2011 | Miyamoto et al. | 361/679.31 |

* cited by examiner

*Primary Examiner* — Gregory Thompson
(74) *Attorney, Agent, or Firm* — Altis Law Group, Inc.

(57) ABSTRACT

A container data center includes a container, at least one power supplying assembly, at least one cooling assembly, and at least one server assembly. The power supplying assembly, the cooling assembly, and the server assembly are received in the container. The cooling assembly is positioned between the power supplying assembly and the server assembly. The power supplying assembly includes a first frame and a plurality of power boxes supported in the first frame, and is for supplying power to the cooling assembly and the server assembly. The cooling assembly includes a second frame and a plurality of cooling devices supported in the second frame, and is for cooling the power supplying assembly and the server assembly. The server assembly includes a third frame and a plurality of servers supported in the third frame.

9 Claims, 3 Drawing Sheets

CONTAINER DATA CENTER

BACKGROUND

1. Technical Field

The present disclosure relates to data centers, and particularly to a container data center.

2. Description of Related Art

Container data centers each typically include a container, a number of servers, a number of cooling devices, and a number of power supplies. Each of the servers is assembled in the container with one cooling device and one power supply to cooperatively form a server module. The server modules need to be assembled in the container one by one. When a server module is assembled or detached, the positions of the other server modules also need to be changed. Therefore, the container data center is hard to assemble and detach.

Therefore, it is desirable to provide a container data center, which can overcome the limitations described.

DETAILED DESCRIPTION

Embodiments of the disclosure will now be described in detail, with reference to the accompanying drawings.

Figure 1:
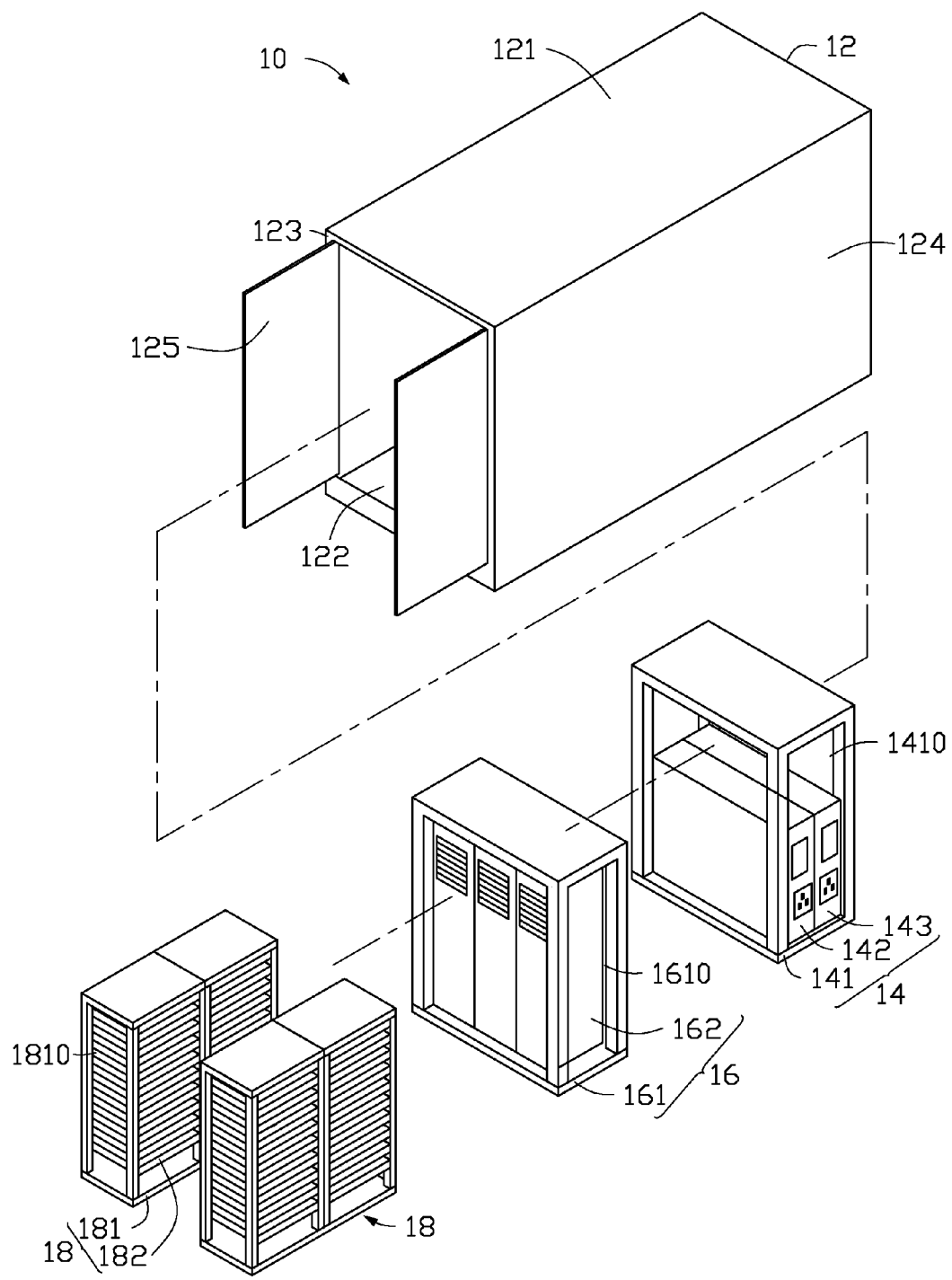
FIG. 1 is an isometric view of a container data center in accordance with an exemplary embodiment.
Figure 2:
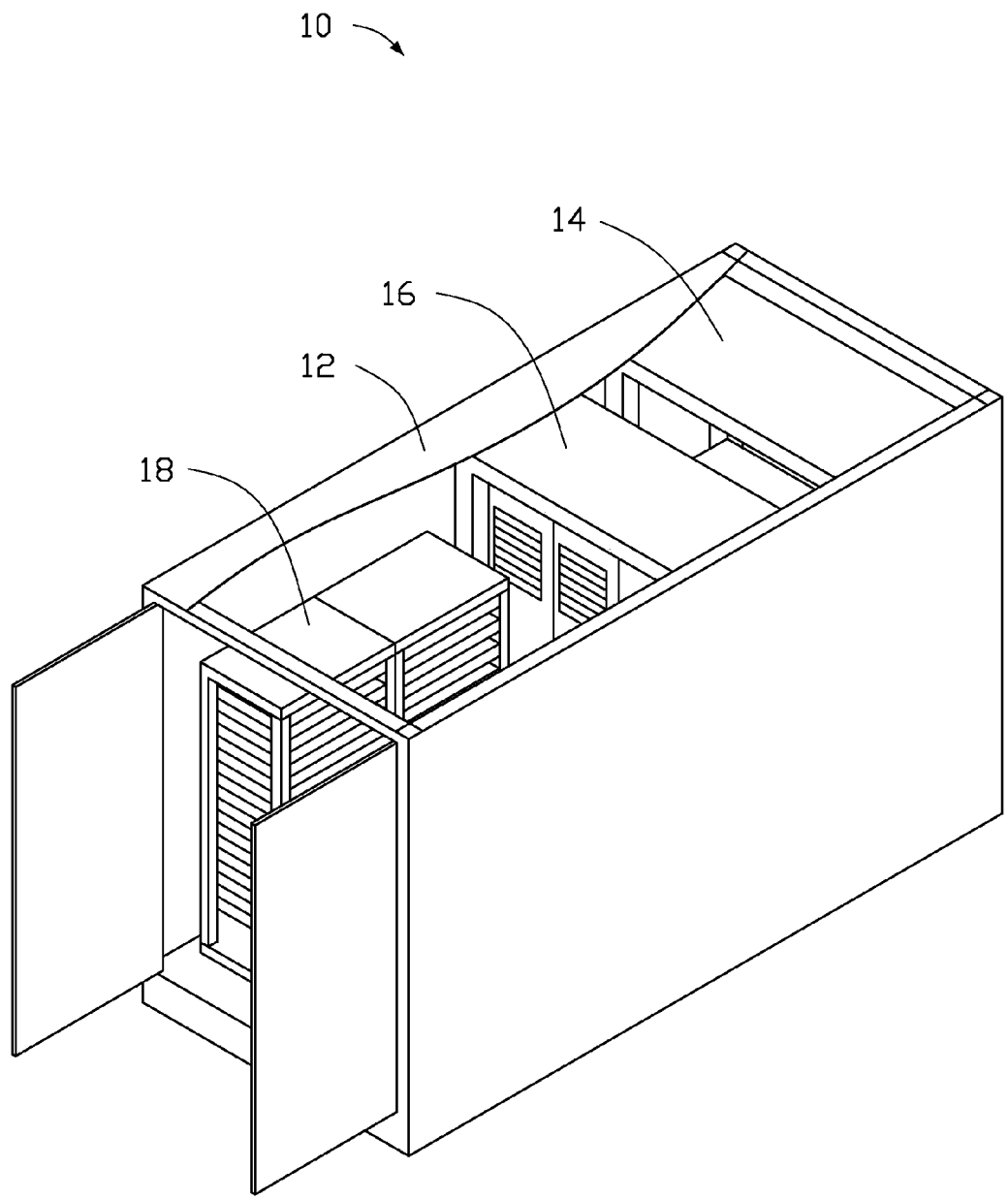
FIG. 2 is an assembled view of the container data center of FIG. 1.

Referring to FIGS. 1-2, a container data center 10, according to an exemplary embodiment, includes a container 12, at least one power supply assembly 14, at least one cooling assembly 16, and at least one server assembly 18. The at least one power supplying assembly 14, the at least one cooling assembly 16, and the at least one server assembly 18 are assembled in the container 12. In this embodiment, the number of the power supplying assembly 14 and the cooling assembly 16 is one, and the number of the server assembly 18 is two.

The container 12 is rectangular shaped, and includes an upper plate 121, a lower plate 122, two first sidewalls 123, and two second sidewalls 124. The lower plate 122 is opposite to the upper plate 121. The two first sidewalls 123 are perpendicularly connected between two opposite edges of the upper plate 121 and the lower plate 122. The two second sidewalls 124 are perpendicularly connected between another two opposite edges of the upper plate 121 and the lower plate 122. The container 12 further includes two doors 125 formed on one of the first sidewalls 123. The door 125 opens and closes the container 12.

The power supplying assembly 14 is received in the container 12, and includes a first supporting frame 141, a number of power boxes 142, and a number of uninterruptible power supply (UPS) units 143. The first supporting frame 141 is rectangular shaped, and has a first receiving room 1410. The power boxes 142 and the UPS units 143 are received in the first receiving room 1410. The power boxes 142 connect to an external power source (not shown) and supply power to the server assembly 18. The UPS units 143 supply power to the server assembly 18 when the power boxes 142 are disconnected from the external power source. In this embodiment, the power boxes 142 and the UPS units 143 are detachably fixed on the first supporting frame 141 with screws. The power boxes 142 and the UPS units 143 can be moved with the first supporting frame 141 as a whole.

The cooling assembly 16 is received in the container 12, and includes a second supporting frame 161 and a number of cooling devices 162. The second supporting frame 161 is rectangular shaped, and has a second receiving room 1610. The cooling devices 162 are received in the second receiving room 1610. The cooling devices 162 output cool air. In this embodiment, the cooling devices 162 are detachably fixed on the second supporting frame 161 with screws. The cooling devices 162 can be moved with the second supporting frame 161 as a whole.

Each of the two server assemblies 18 is received in the container 12, and includes a third supporting frame 181 and a number of servers 182. The third supporting frame 181 is rectangular shaped, and has a third receiving room 1810. The servers 182 are received in the third receiving room 1810. In this embodiment, the servers 182 are detachably fixed on the third supporting frame 181 with screws. The servers 182 can be moved with the third supporting frame 181 as a whole.

In assembly, the power supplying assembly 14 is movably positioned on the lower plate 122 and is adjacent to the first sidewall 123 facing away the door 125. The cooling assembly 16 is movably position on the lower plate 122 and is adjacent to the power supplying assembly 14. The server assemblies 18 are movably position on the lower plate 122 and are adjacent to the doors 125. The server assemblies 18 are spaced apart from the two second sidewalls 124. The power boxes 142 are connected to the external power source, and supply power to the cooling devices 162 and the servers 182.

In this embodiment, an air flowing direction of the cooling devices 162 is perpendicular to the first sidewalls 123. The two server assemblies 18 are parallelly positioned on the lower plate 122 and form a dissipation channel 126 therebetween. An extending direction of the dissipation channel 126 is perpendicular to the first sidewalls 123.

Figure 3:
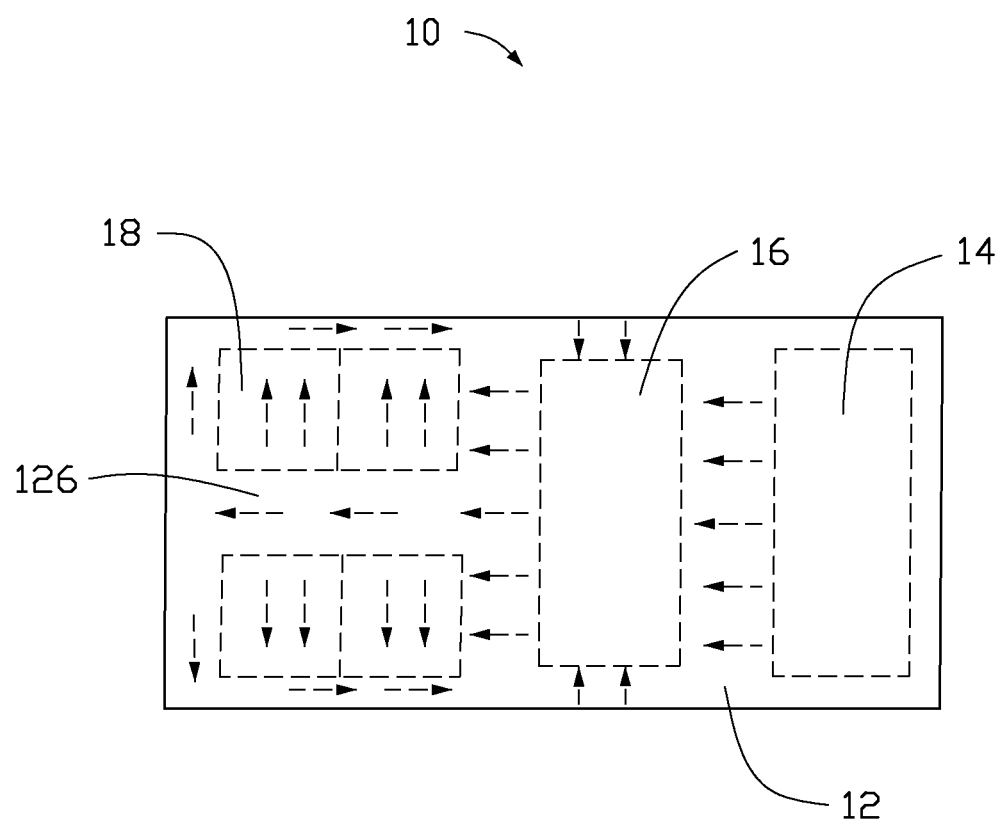
FIG. 3 is a schematic view showing the air flowing of the container data center of FIG. 1.

Referring to FIG. 3, a heat flowing generated from the power supplying assembly 14 is absorbed and cooled by the cooling assembly 16. An air flow output from the cooling assembly 16 flows to the two server assemblies 18 and the dissipation channel 126. The air flow takes the heat dissipated from the server assemblies 18 and cycles to the cooling assembly 16.

As the power supplying assembly 14, the cooling assembly 16, and the server assemblies 18 are respectively assembled as a module, when one of the devices, such as the power boxes 142, the UPS units 143, the cooling devices 162, and the servers 182, needs to be assembled, a user can accurately and easily assemble this device on the corresponding module. What is more, as all of the servers 182 are assembled in one module, the server assemblies 18 can be easily cooled by the air flow output from the cooling assembly 16.

Particular embodiments are shown and described by way of illustration only. The principles and the features of the present disclosure may be employed in various and numerous embodiments thereof without separating from the scope of the disclosure. The above-described embodiments illustrate the scope of the disclosure but do not restrict the scope of the disclosure.

What is claimed is:

1. A container data center, comprising:
  a container;
  at least one power supplying assembly received in the container, the at least one power supplying assembly comprising a first frame and a plurality of power boxes supported in the first frame;

at least one cooling assembly received in the container, the at least one cooling assembly comprising a second frame and a plurality of cooling devices supported in the second frame; and at least one server assembly received in the container, the at least one server assembly comprising a third frame and a plurality of servers supported in the third frame;

wherein the at least one cooling assembly is positioned between the at least one power supplying assembly and the at least one server assembly, the at least one power supplying assembly is configured for supplying power to the at least one cooling assembly and the at least one server assembly; the at least one cooling assembly is configured for cooling the at least one power supplying assembly and the at least one server assembly.

2. The container data center of claim 1, wherein the container is rectangular shaped, and comprises an upper plate, a lower plate, two first sidewalls, and two second sidewalls; the lower plate is opposite to the upper plate; the two first sidewalls are perpendicularly connected between two opposite edges of each of the upper plate and the lower plate; the two second sidewalls are perpendicularly connected between another two opposite edges of each of the upper plate and the lower plate.

3. The container data center of claim 2, wherein the container defines two doors on one of the first sidewalls, the doors are configured for opening and closing the container.

4. The container data center of claim 3, wherein the at least one power supplying assembly is movably position on the lower plate and is adjacent to the first sidewall that faces away from the doors.

5. The container data center of claim 3, wherein the at least one server assembly is movably position on the lower plate and is adjacent to the doors.

6. The container data center of claim 5, wherein the at least one server assembly comprises two server assemblies, the two server assemblies are parallelly positioned on the lower plate and define a dissipation channel therebetween, the two server assemblies are spaced apart from the second sidewalls.

7. The container data center of claim 6, wherein an extending direction of the dissipation channel is perpendicular to the first sidewalls, an air flowing outputted from the at least one cooling assembly flows through the dissipation channel and cycles to the at least one cooling assembly.

8. The container data center of claim 1, wherein the at least one power supplying assembly further comprises a plurality of uninterruptible power supply (UPS) units supported in the first frame.

9. The container data center of claim 8, wherein the power boxes are configured for connecting to an external power source and supplying power to the at least one server assembly and the at least one cooling assembly, the UPS units are configured for supplying power to the at least one server assembly and the at least one cooling assembly when the power boxes are disconnected to the external power source.

* * * * *